United States Patent
Wuu et al.

(10) Patent No.: US 9,142,719 B2
(45) Date of Patent: Sep. 22, 2015

(54) PATTERNED SUBSTRATE AND LIGHT-EMITTING DIODE HAVING THE SAME

(75) Inventors: Dong-Sing Wuu, Taichung (TW); Ray-Hua Horng, Taichung (TW); Wei-Ting Lin, Taichung (TW)

(73) Assignee: NATIONAL CHUNG-HSING UNIVERSITY, Taichung (TW)

(*) Notice: Subject to any disclaimer, the term of this patent is extended or adjusted under 35 U.S.C. 154(b) by 91 days.

(21) Appl. No.: 13/242,414

(22) Filed: Sep. 23, 2011

(65) Prior Publication Data

US 2012/0074453 A1 Mar. 29, 2012

(30) Foreign Application Priority Data

Sep. 27, 2010 (TW) ............................... 99132589 A

(51) Int. Cl.
  *H01L 21/02* (2006.01)
  *H01L 33/20* (2010.01)
  *H01L 33/00* (2010.01)

(52) U.S. Cl.
  CPC ............ *H01L 33/20* (2013.01); *H01L 21/0242* (2013.01); *H01L 21/0243* (2013.01); *H01L 21/0254* (2013.01); *H01L 21/02458* (2013.01); *H01L 33/007* (2013.01)

(58) Field of Classification Search
  CPC . H01L 33/22; H01L 21/0242; H01L 21/0243; H01L 33/0066; H01L 33/007; H01L 33/0079; H01L 33/20
  USPC ............................................ 257/94, 103, 190
  See application file for complete search history.

(56) References Cited

U.S. PATENT DOCUMENTS

| 5,872,022 | A  | * | 2/1999  | Motoda et al. ................ 438/39 |
| 6,870,191 | B2 | * | 3/2005  | Niki et al. ..................... 257/79 |
| 7,253,450 | B2 | * | 8/2007  | Senda et al. ................. 257/100 |
| 7,342,261 | B2 |   | 3/2008  | Wuu et al. |
| 7,732,802 | B2 | * | 6/2010  | Cho et al. ...................... 257/13 |
| 8,314,436 | B2 | * | 11/2012 | Shim ............................ 257/94 |
| 8,384,111 | B2 | * | 2/2013  | Tadatomo et al. ............. 257/98 |
| 8,519,412 | B2 | * | 8/2013  | Son et al. ..................... 257/79 |
| 8,946,772 | B2 | * | 2/2015  | Okagawa et al. ............ 257/190 |
| 8,993,993 | B2 | * | 3/2015  | Ko et al. ...................... 257/13 |
| 2004/0113166 | A1 |   | 6/2004  | Tadatomo et al. |
| 2006/0267025 | A1 | * | 11/2006 | Wuu et al. ..................... 257/79 |
| 2007/0262330 | A1 |   | 11/2007 | Lee et al. |
| 2008/0203421 | A1 | * | 8/2008  | Bechtel et al. ................ 257/99 |
| 2008/0230793 | A1 | * | 9/2008  | Yoon et al. .................... 257/94 |
| 2009/0014751 | A1 | * | 1/2009  | Kim et al. ................... 257/103 |
| 2010/0059789 | A1 | * | 3/2010  | Choi ............................ 257/103 |

(Continued)

FOREIGN PATENT DOCUMENTS

JP  2007-036174   2/2007
JP  2008270689    11/2008

*Primary Examiner* — Jay C Kim
(74) *Attorney, Agent, or Firm* — Duane Morris LLP

(57) ABSTRACT

A patterned substrate for epitaxially forming a light-emitting diode includes: a top surface; a plurality of spaced apart recesses, each of which is indented downwardly from the top surface and each of which is defined by a recess-defining wall, the recess-defining wall having a bottom wall face, and a surrounding wall face that extends from the bottom wall face to the top surface; and a plurality of protrusions, each of which protrudes upwardly from the bottom wall face of the recess-defining wall of a respective one of the recesses. A light-emitting diode having the patterned substrate is also disclosed.

7 Claims, 7 Drawing Sheets

(56) References Cited

U.S. PATENT DOCUMENTS

| | | | |
|---|---|---|---|
| 2011/0037098 A1* | 2/2011 | Kim et al. | 257/190 |
| 2011/0042711 A1* | 2/2011 | Choi et al. | 257/103 |
| 2012/0138985 A1* | 6/2012 | Ono et al. | 257/98 |

\* cited by examiner

US 9,142,719 B2

PATTERNED SUBSTRATE AND LIGHT-EMITTING DIODE HAVING THE SAME

CROSS-REFERENCE TO RELATED APPLICATION

This application claims priority of Taiwanese application No. 099132589, filed on Sep. 27, 2010.

BACKGROUND OF THE INVENTION

1. Field of the Invention

This invention relates to a patterned substrate and a light-emitting diode having the patterned substrate.

2. Description of the Related Art

A light-emitting diode (LED) has been widely used in a backlight module of a display, a traffic light, a lighting equipment, etc. When the LED serves as a light source for illumination or for supplying optical energy, a sufficient luminance is one of the basic requirements for the LED.

Therefore, in order to solve the problem of insufficient luminance of the LED, the inventors of this application had proposed a light-emitting element that is disclosed in Taiwan patent no. 1236773. Referring to FIGS. 1 and 2, the light-emitting element includes a substrate 11 that is primarily made of sapphire, an epitaxial layer unit 12 formed on the substrate 11, a Ti/Al/Ti/Au contact electrode 13, and a Ni/Au contact electrode 14.

The substrate 11 is patterned, and has a top surface 111, and a plurality of recesses 112 that are indented downwardly from the top surface 111 and that are spaced apart from each other. Each of the recesses 112 has a depth of 1.5 microns, and a bottom wall face having a diameter of 3 microns. A center-to-center distance between adjacent ones of the recesses is greater than 3 microns (for example, 5 microns).

The epitaxial layer unit 12 primarily made of a GaN material is formed on the top surface 111 of the substrate 11 and fills the recesses 112. The epitaxial layer unit 12 includes, from bottom to top, an n-type semiconductor layer 121 that is formed on the top surface 111 of the substrate 11 and that fills the recesses 112, a light-emitting layer 122 that partially covers the n-type semiconductor layer 121 and that is capable of emitting light with a predetermined range of wavelength, and a p-type semiconductor layer 123 covering the light-emitting layer 122.

The Ti/Al/Ti/Au contact electrode 13 and the Ni/Au contact electrode 14 are respectively disposed on the n-type semiconductor layer 121 and the p-type semiconductor layer 123, and are used to supply electricity to the epitaxial layer unit 12.

After external electricity is applied to the Ti/Al/Ti/Au contact electrode 13 and the Ni/Au contact electrode 14, the electricity flows to the n-type semiconductor layer 121, the p-type semiconductor layer 123, and the light-emitting layer 122, and is converted to optical energy to emit light outwardly.

When the light from the light-emitting layer 122 toward the substrate 11 travels to the top surface 111 and the recesses 112 of the substrate 11, the light can be reflected by the top surface 111 and the recesses 112 more than one time. Accordingly, the luminance of the light-emitting element is higher than that of a light-emitting element without a patterned substrate.

On the other hand, the recesses 112 may efficiently reduce defects and dislocation of the epitaxial layer unit 12. Therefore, an internal quantum efficiency of the light-emitting element may be enhanced, thereby resulting in an increase in luminance of the light-emitting element.

Because the patterned substrate 11 may efficiently improve the quality of the epitaxial layer unit 12 and may vary a traveling pathway of the light, studies to further enhance the luminance of the light-emitting element by varying patterns on the substrate 11 are continuously ongoing.

SUMMARY OF THE INVENTION

Therefore, the object of the present invention is to provide a patterned substrate and a light-emitting diode that has the patterned substrate and that has a relatively high luminance.

According to one aspect of the present invention, a patterned substrate for epitaxially forming light-emitting diode comprises:
a top surface;
a plurality of spaced apart recesses, each of which is indented downwardly from the top surface and each of which is defined by a recess-defining wall, the recess-defining wall having a bottom wall face, and a surrounding wall face that extends from the bottom wall face to the top surface; and
a plurality of protrusions, each of which protrudes upwardly from the bottom wall face of the recess-defining wall of a respective one of the recesses.

According to another aspect of the present invention, a light-emitting diode comprises:
a patterned substrate including:
a top surface;
a plurality of spaced apart recesses, each of which is indented downwardly from the top surface and each of which is defined by a recess-defining wall, the recess-defining wall having a bottom wall face, and a surrounding wall face that extends from the bottom wall face to the top surface; and
a plurality of protrusions, each of which protrudes upwardly from the bottom wall face of the recess-defining wall of a respective one of the recesses;
an epitaxial layer unit epitaxially formed on the top surface of the substrate; and
an electrode unit electrically connected to the epitaxial layer unit.

BRIEF DESCRIPTION OF THE DRAWINGS

Other features and advantages of the present invention will become apparent in the following detailed description of the preferred embodiment of the invention, with reference to the accompanying drawings, in which.

DETAILED DESCRIPTION OF THE PREFERRED EMBODIMENT

Figure 3:
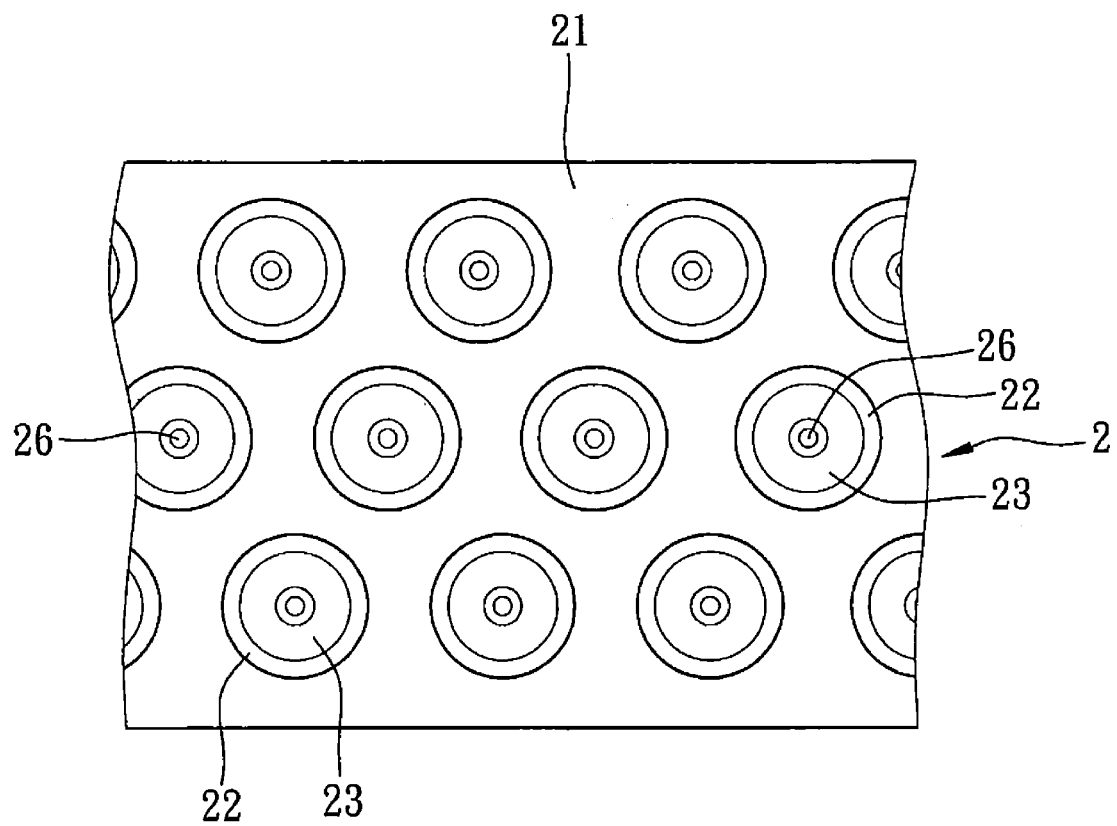
FIG. 3 is a top view of the preferred embodiment of a patterned substrate according to this invention.
Figure 4:
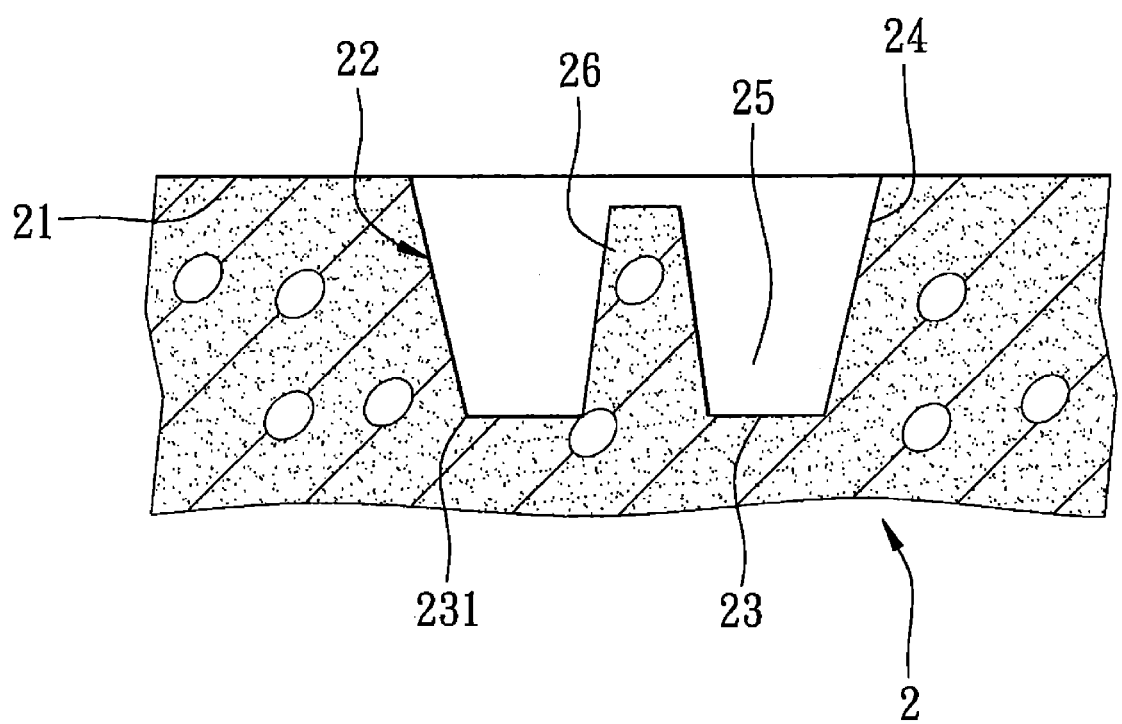
FIG. 4 is a cross-sectional view of the patterned substrate of FIG. 3.

Referring to FIGS. 3 and 4, the preferred embodiment of a patterned substrate 2 for epitaxially forming light-emitting diode according to this invention has a sapphire structure, and comprises a top surface 21 that is a sapphire (0001) face, a plurality of spaced apart recesses 25, and a plurality of protrusions 26.

Each of the recesses 25 is indented downwardly from the top surface 21 and is defined by a recess-defining wall 22. The recess-defining wall 22 has a bottom wall face 23 with a peripheral edge 231, and a surrounding wall face 24 extending from the peripheral edge 231 of the bottom wall face 23 to the top surface 21. Each of the protrusions 26 protrudes upwardly from the bottom wall face 23 of the recess-defining wall 22 of a respective one of the recesses 25.

In this embodiment, the bottom wall face 23 of each of the recesses 25 is a circular surface parallel to the top surface 21, and thus is also a sapphire (0001) face. The surrounding wall face 24 of each of the recesses 25 has a circular cross-section that tapers from the top surface 21 toward the bottom wall face 23. Each of the recesses 25 has a truncated conical shape. Each of the bottom wall faces 23 has a diameter ranging from 2 microns to 7 microns. The bottom wall face 23 of each of the recesses 25 has a depth from the top surface 21 ranging from 0.5 micron to 5 microns. A center-to-center distance between adjacent ones of the recesses 25 is not less than the diameter of each of the bottom wall faces 23.

Each of the protrusions 26 has a circular cross-section that tapers from the bottom wall surface 23 toward the top surface 21, and thus has a truncated conical shape. Each of the protrusions 26 has a maximum cross-section having a diameter of not greater than 7 microns, and is spaced apart from the surrounding wall face 24 of the recess-defining wall 22 of the respective one of the recesses 25. In addition, each of the protrusions 26 has a height not greater than the depth of the bottom wall face 23, and greater than one half of the depth of the bottom wall face 23. Accordingly, each of the protrusions 26 does not protrude outwardly from the top surface 21.

The recesses 25 and the protrusions 26 are formed as follows. A mask, which has a pattern of a plurality of concentric circles arranged in an array, is disposed on a top surface 21 of a sapphire substrate, that has a sapphire (0001) face, followed by dry etching to form the recesses 25 and the protrusions 26 in the sapphire substrate. With the mask having the pattern of concentric circles, each of the protrusions 26 is formed on a geometric center of the respective bottom wall face 23. When viewing the patterned substrate 2 from above, the surrounding wall faces 24, the bottom wall faces 23, and the protrusions 26 are in the form of concentric circles (see FIG. 3).

It should be noted that the cross-sections of the bottom wall faces 23, the surrounding wall faces 24, and the protrusions 26 are not limited to circular shapes, and may be other polygon shapes such as square or hexagon.

Figure 5:
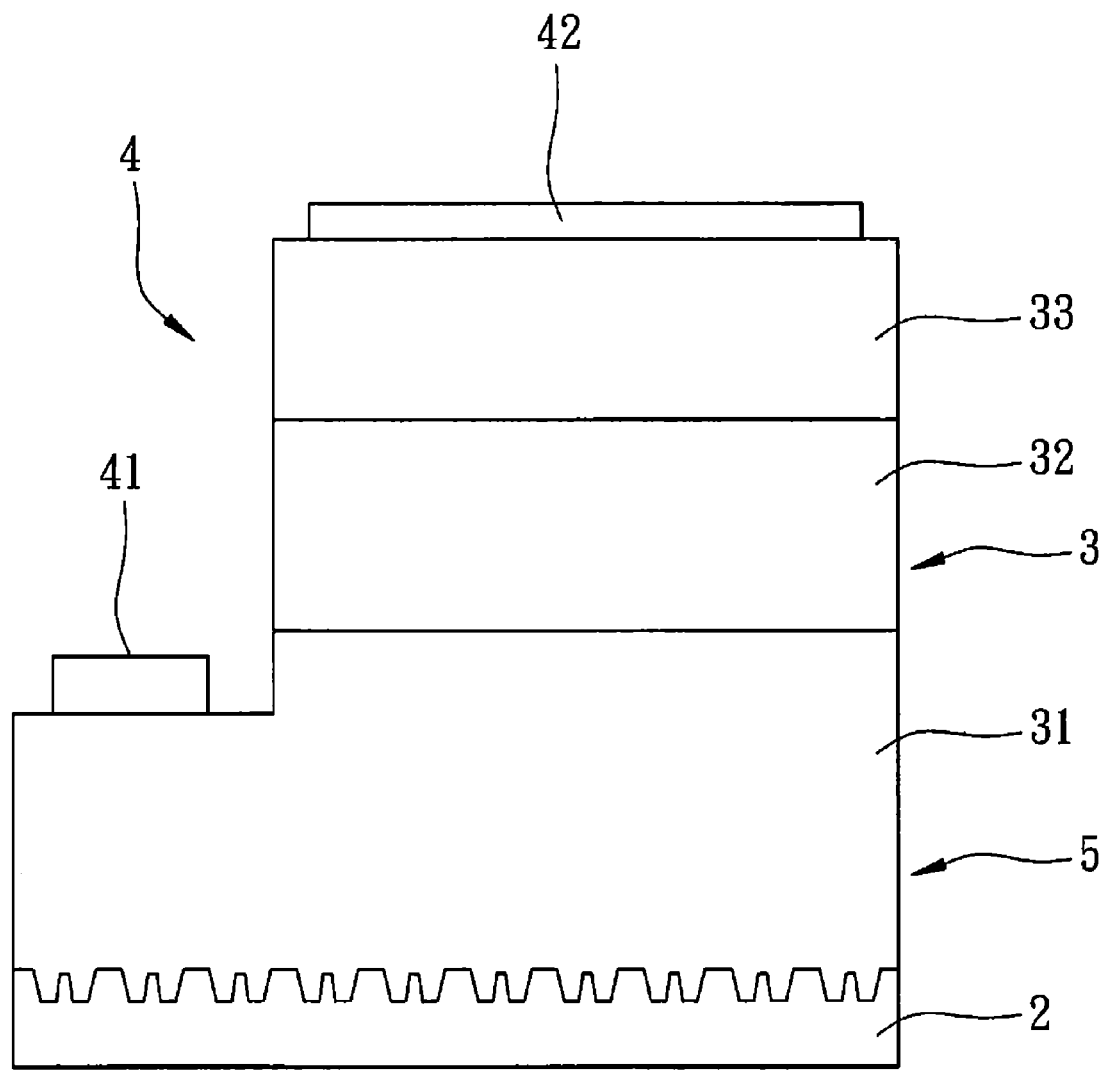
FIG. 5 is a schematic view of the preferred embodiment of a light-emitting diode having the patterned substrate according to this invention.

Referring to FIG. 5, after epitaxially forming an epitaxial layer unit 3 on the patterned substrate 2 and after forming an electrode unit 4 on the epitaxial layer unit 3, the preferred embodiment of a light-emitting diode 5 according to the present invention is obtained. The patterned substrate 2 is as previously defined, and the detailed descriptions thereof are not repeated for the sake of brevity.

The epitaxial layer unit 3 is made of a GaN series semiconductor material, and includes, from bottom to top, an n-type semiconductor layer 31 that is formed on the top surface 21 of the substrate 2 and that fills spaces in the recesses 25, a light-emitting layer 32, and a p-type semiconductor layer 33. Preferably, the n-type and p-type semiconductor layer 31, 33 are n-GaN and p-GaN semiconductor layers, respectively.

The electrode unit 4 has first and second electrodes 41, 42 that are electrically connected to and formed on the n-type and p-type semiconductor layers 31, 33, respectively, and are adapted to electrically connect to an external power source (not shown).

When the electrode unit 4 connects to the external power source, the electrical energy is transmitted to the light-emitting layer 32 through the n-type and the p-type semiconductor layers 31, 33, and is converted into optical energy by the light-emitting layer 32, thereby emitting light.

The light from the light-emitting layer 32 toward the p-type semiconductor layer 33 travels through the second electrode 42 and is emitted outwardly. On the other hand, the light from the light-emitting layer 32 toward the n-type semiconductor layer 31 is reflected and diffracted by the top surface 21, the surrounding wall faces 24, the bottom wall faces 23 and the protrusions 26 to travel upwardly. With the protrusions 26 formed in the recesses 25, the light-emitting diode 5 of this invention exhibits superior luminance over that of the conventional light-emitting element having the patterned substrate 11 shown in FIG. 1.

Figure 1:
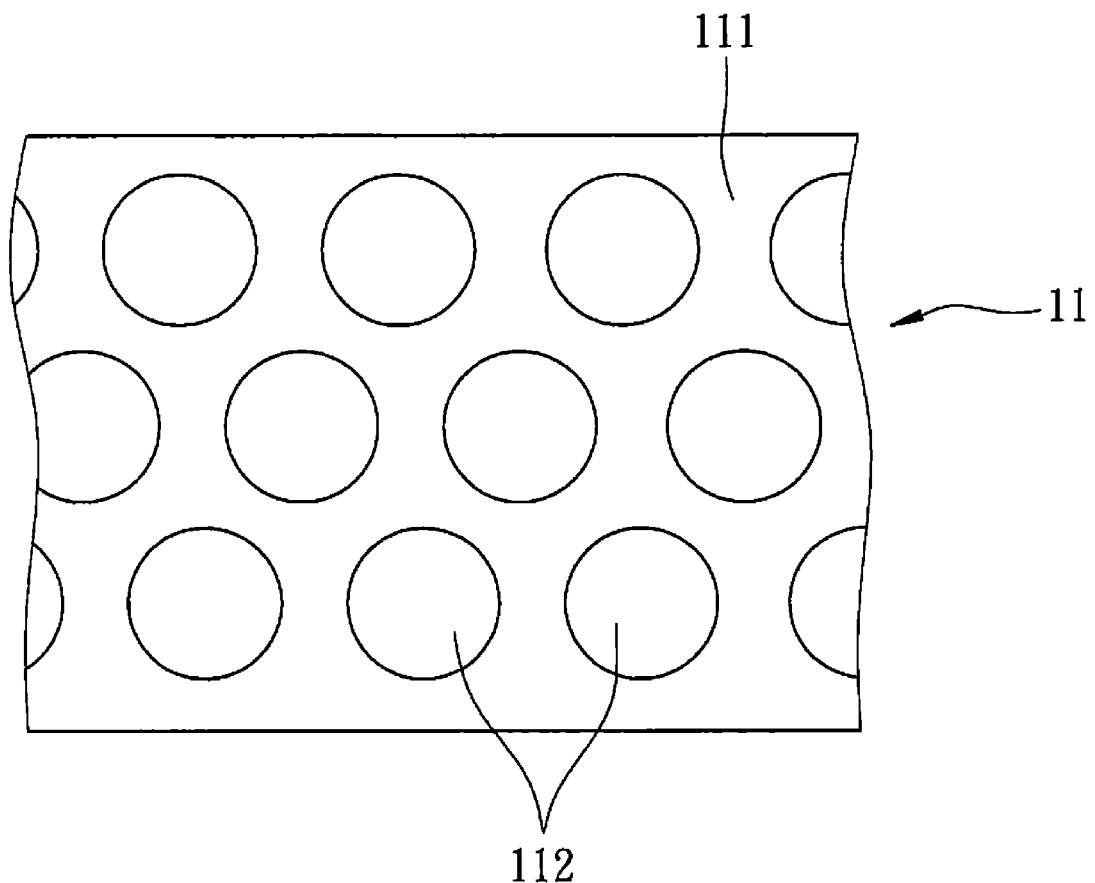
FIG. 1 is a top view of a conventional patterned substrate.
Figure 2:
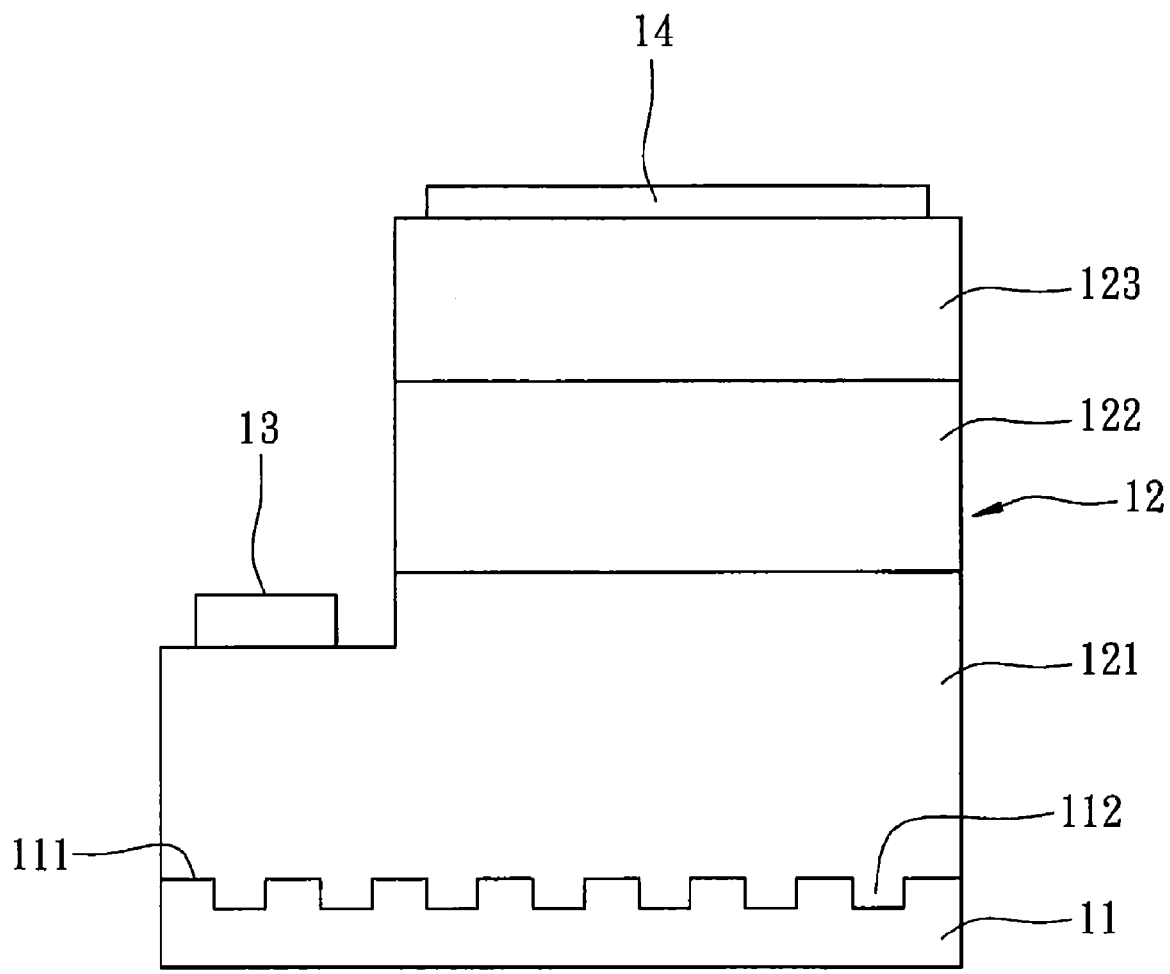
FIG. 2 is a schematic view of a light-emitting element having the patterned substrate of FIG. 1.
Figure 6A:
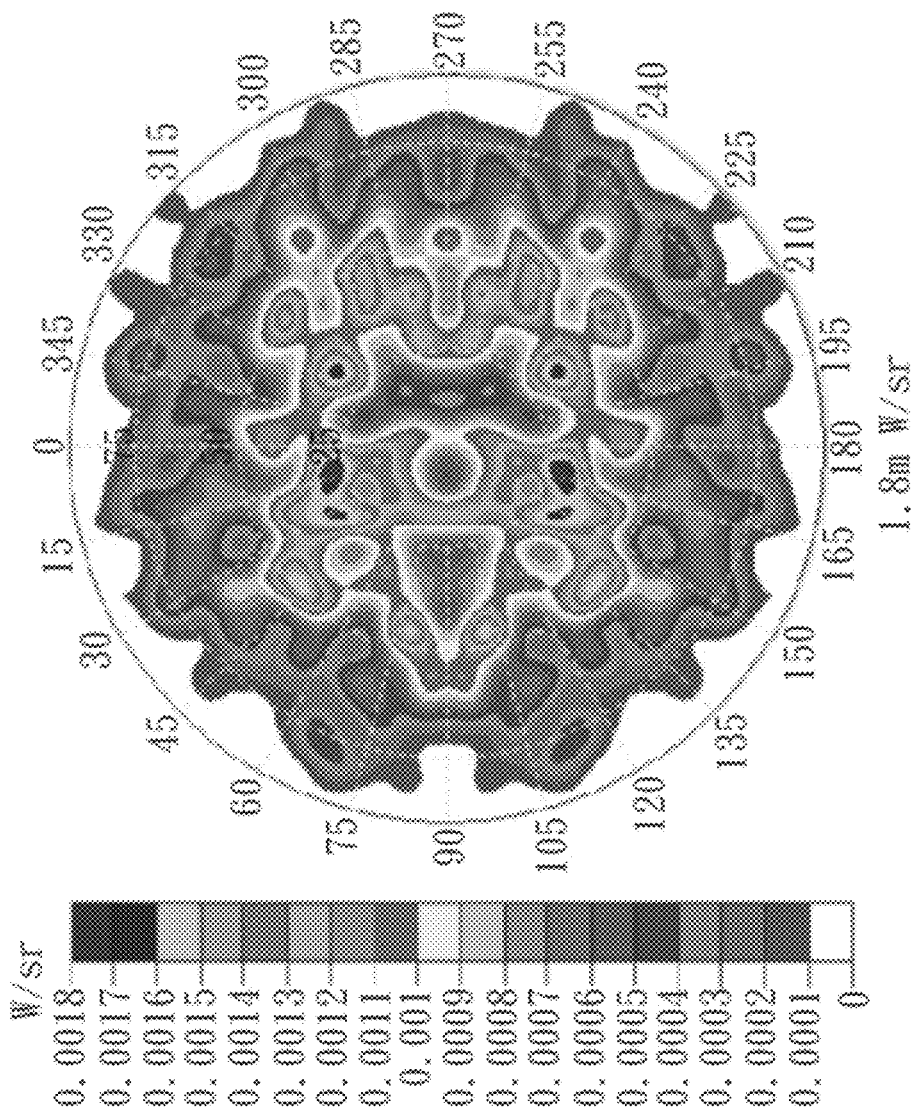
FIG. 6(a) is a candlepower distribution curve of the conventional light-emitting element shown in FIG. 2.
Figure 6B:
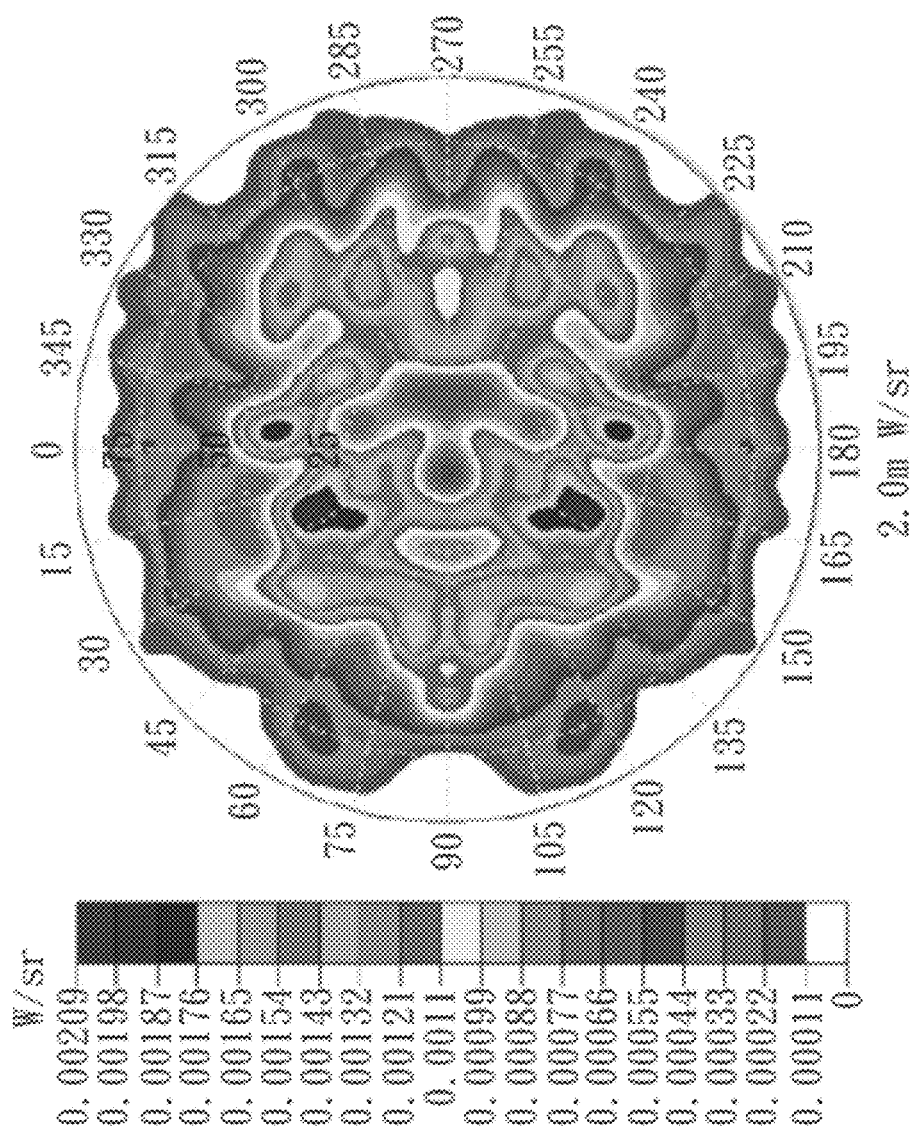
FIG. 6(b) is a candlepower distribution curve of the light-emitting diode shown in FIG. 5.

FIG. 6(a) is a candlepower distribution curve of the conventional light-emitting element using the patterned substrate 11 as shown in FIG. 1, which indicates that the conventional light-emitting element has a radiant intensity of 1.8 mW/sr. FIG. 6(b) is a candlepower distribution curve of the light-emitting diode of this invention, which indicates that the light-emitting diode of this invention has a radiant intensity of 2.0 mW/sr. The results from FIGS. 6(a) and 6(b) demonstrate that the luminance (the radiant intensity) of the light-emitting diode 5 of this invention is greater by about 10 percent of that of the conventional light-emitting element.

With the patterned substrate 2 having the recesses 25 and the protrusions 26, the defects and dislocation of the epitaxial layer unit 3 may be reduced. Besides, the light emitted from the epitaxial layer unit 3 may be reflected and diffracted by the patterned substrate 2 in a more efficient way, thereby resulting in improved luminance of the light-emitting diode 5 of this invention.

While the present invention has been described in connection with what is considered the most practical and preferred embodiment, it is understood that this invention is not limited to the disclosed embodiment but is intended to cover various arrangements included within the spirit and scope of the broadest interpretations and equivalent arrangements.

What is claimed is:

1. A patterned substrate for epitaxially forming a light-emitting diode, comprising:
   a substrate body including:
   a top crystalline surface for epitaxial growth thereon;
   a plurality of spaced apart recesses, each of which extends downwardly from said top crystalline surface to terminate at a lower planar crystalline region that includes a central zone and a surrounding zone that surrounds said central zone; and
   a plurality of protrusions, each of which extends upwardly from said central zone of said lower planar crystalline region of a respective one of said recesses to terminate at an upper end surface that stops short of said top crystalline surface, wherein each of said recesses has a depth, and each of said protrusions has a height which is not greater than the depth of each of said recesses and greater than one half of the depth of each of said recesses, wherein said lower planar crystalline region has a diameter ranging from 2 microns to 7 microns, and a center-to-center distance between adjacent ones of said recesses is not less than said diameter of said lower planar crystalline region.

2. The patterned substrate of claim 1, wherein the depth of each of said recesses ranges from 0.5 micron to 5 microns.

3. The patterned substrate of claim 1, wherein said substrate body is made of sapphire, said top crystalline surface and said surrounding zone of said lower planar crystalline region of each of said recesses being sapphire (0001) faces.

4. A light-emitting diode, comprising:
a substrate body including:
a top crystalline surface for epitaxial growth thereon;
a plurality of spaced apart recesses, each of which extends downwardly from said top crystalline surface to terminate at a lower planar crystalline region that includes a central zone and a surrounding zone that surrounds said central zone; and
a plurality of protrusions, each of which extends upwardly from said central zone of said lower planar crystalline region of a respective one of said recesses to terminate at an upper end surface that stops short of said top crystalline surface, wherein each of said recesses has a depth, and each of said protrusions has a height which is not greater than the depth of each of said recesses and greater than one half of the depth of each of said recesses, and wherein said lower planar crystalline region has a diameter ranging from 2 microns to 7 microns, and a center-to-center distance between adjacent ones of said recesses is not less than said diameter of said lower planar crystalline region;
an epitaxial layer unit which is grown epitaxially from said top crystalline surface and said surrounding zone of said lower planar crystalline region of each of said recesses, and which includes a first type semiconductor layer disposed on said substrate body, a second type semiconductor layer, and a light-emitting layer sandwiched between said first and second type semiconductor layers; and
an electrode unit including a first electrode electrically connected to said first type semiconductor layer, and a second electrode electrically connected to said second type semiconductor layer.

5. The light-emitting diode of claim 4, wherein the depth of each of said recesses ranges from 0.5 micron to 5 microns.

6. The light-emitting diode of claim 4, wherein said substrate body is made of sapphire, said top crystalline surface and said surrounding zone of said lower planar crystalline region of each of said recesses being sapphire (0001) faces.

7. The light-emitting diode of claim 4, wherein said epitaxial layer unit is formed of a semiconductor compound including groups III and V elements.

* * * * *